US008592327B2

(12) United States Patent
Ranjan et al.

(10) Patent No.: US 8,592,327 B2
(45) Date of Patent: Nov. 26, 2013

(54) FORMATION OF SIOCL-CONTAINING LAYER ON EXPOSED LOW-K SURFACES TO REDUCE LOW-K DAMAGE

(75) Inventors: Alok Ranjan, Slingerlands, NY (US); Kaushik Arun Kumar, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 87 days.

(21) Appl. No.: 13/413,878

(22) Filed: Mar. 7, 2012

(65) Prior Publication Data
US 2013/0237060 A1 Sep. 12, 2013

(51) Int. Cl.
H01L 21/31 (2006.01)
H01L 21/469 (2006.01)

(52) U.S. Cl.
USPC ........... 438/786; 438/618; 438/622; 438/710; 438/737; 438/778

(58) Field of Classification Search
USPC ................ 438/618, 622, 710, 737, 778, 786
See application file for complete search history.

(56) References Cited

U.S. PATENT DOCUMENTS

| | | | |
|---|---|---|---|
| 6,207,544 B1 | 3/2001 | Nguyen et al. | |
| 6,242,334 B1 | 6/2001 | Huang et al. | |
| 6,261,913 B1 | 7/2001 | Akram et al. | |
| 6,277,700 B1 | 8/2001 | Yu et al. | |
| 6,756,313 B2 | 6/2004 | Choi et al. | |
| 7,192,881 B2 | 3/2007 | Kammler et al. | |
| 7,342,290 B2 | 3/2008 | Burnham et al. | |
| 7,393,788 B2 | 7/2008 | Cook | |
| 7,553,769 B2 | 6/2009 | Toma et al. | |
| 7,723,237 B2 | 5/2010 | Hyland et al. | |
| 7,741,224 B2 | 6/2010 | Jiang et al. | |
| 7,795,148 B2 | 9/2010 | Brown | |
| 2003/0049571 A1 | 3/2003 | Hallock | |
| 2006/0115981 A1 | 6/2006 | Shieh | |
| 2006/0148269 A1 | 7/2006 | Powell | |
| 2006/0266478 A1* | 11/2006 | Lee et al. | 156/345.24 |
| 2009/0146296 A1 | 6/2009 | Ye et al. | |
| 2009/0203217 A1* | 8/2009 | Lee et al. | 438/710 |
| 2009/0286402 A1* | 11/2009 | Xia et al. | 438/703 |
| 2010/0062592 A1 | 3/2010 | Clark | |
| 2011/0287577 A1 | 11/2011 | Stewart et al. | |
| 2012/0064713 A1* | 3/2012 | Russell et al. | 438/653 |
| 2013/0023124 A1* | 1/2013 | Nemani et al. | 438/703 |

OTHER PUBLICATIONS (Abstract Only) Martin Kogelschatz, Gilles Cunge, and Nader Sadeghi. Analysis of the chemical composition and deposition mechanism of the SiOx-Cly layer on the plasma chamber walls during silicon gate etching. J.Vac.Sci. Technol. A 22, 624 (2004).

* cited by examiner

Primary Examiner — Bac Au

(57) ABSTRACT

A method for protecting an exposed low-k surface is described. The method includes receiving a substrate having a mask layer and a low-k layer formed thereon, wherein a pattern formed in the mask layer using a lithographic process has been transferred to the low-k layer using an etching process to form a structural feature therein. Additionally, the method includes forming a SiOCl-containing layer on exposed surfaces of the mask layer and the low-k layer, and anisotropically removing the SiOCl-containing layer from a top surface of the mask layer and a bottom surface of the structural feature in the low-k layer, while retaining a remaining portion of the SiOCl-containing layer on sidewall surfaces of the structural feature. The method further includes performing an ashing process to remove the mask layer, and thereafter, selectively removing the remaining portion of the SiOCl-containing layer from the sidewall surfaces of the structural feature.

20 Claims, 16 Drawing Sheets

US 8,592,327 B2

FORMATION OF SIOCL-CONTAINING LAYER ON EXPOSED LOW-K SURFACES TO REDUCE LOW-K DAMAGE

FIELD OF INVENTION

The invention relates to a method of mitigating damage to a low dielectric constant (low-k) material.

BACKGROUND OF THE INVENTION

The practical implementation of low-k materials in insulation layer stacks for metal interconnects faces formidable challenges. Ultimately, it is desirable to integrate low-k dielectric materials in metal interconnects that achieve the full benefit of the reduced dielectric constant, while producing a structurally robust, patterned insulation layer with minimal damage. As low-k damage accumulates, it manifests in metal interconnects with inferior performance and poor reliability.

SUMMARY OF THE INVENTION

Embodiments of the invention relate to a method of mitigating damage to a low dielectric constant (low-k) material. According to one embodiment, a method for protecting an exposed low-k surface is described. The method includes receiving a substrate having a mask layer and a low-k layer formed thereon, wherein a pattern formed in the mask layer using a lithographic process has been transferred to the low-k layer using an etching process to form a structural feature therein. Additionally, the method includes forming a SiOCl-containing layer on exposed surfaces of the mask layer and the low-k layer, and anisotropically removing the SiOCl-containing layer from a top surface of the mask layer and a bottom surface of the structural feature in the low-k layer, while retaining a remaining portion of the SiOCl-containing layer on sidewall surfaces of the structural feature. The method further includes performing an ashing process to remove the mask layer, and thereafter, selectively removing the remaining portion of the SiOCl-containing layer from the sidewall surfaces of the structural feature.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1A:
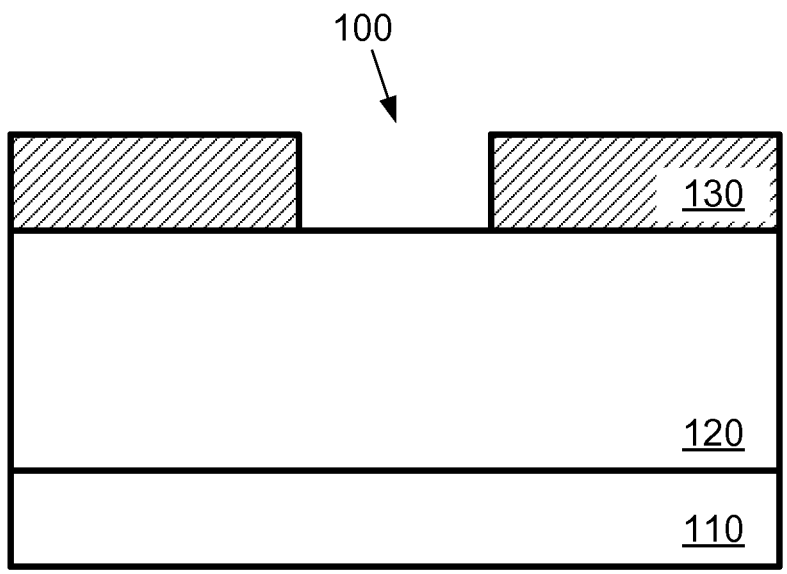
FIGS. 1A through 1C illustrate a schematic representation of a conventional method for patterning a low-k layer.

As noted above in semiconductor manufacturing, when fabricating insulation layer stacks for metal interconnects, the integration of low-k materials has posed many challenges. For example, FIG. 1A provides a pictorial illustration of a conventional methodology for patterning a low-k material. The methodology begins with preparing a low-k layer 120 on a substrate 110. Thereafter, a mask layer 130 having a pattern 100 formed therein is prepared overlying the low-k layer 120. Pattern 100 may include a via pattern or a trench pattern.

Figure 1B:
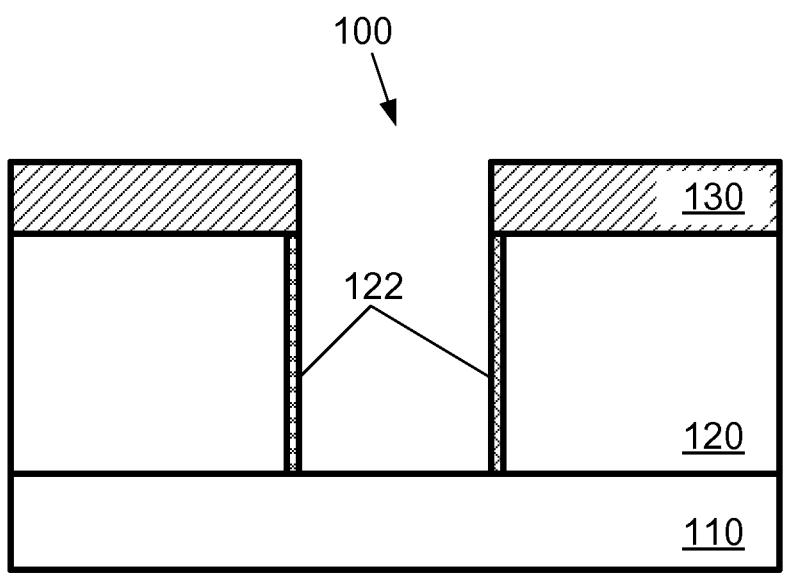
Figure 1C:
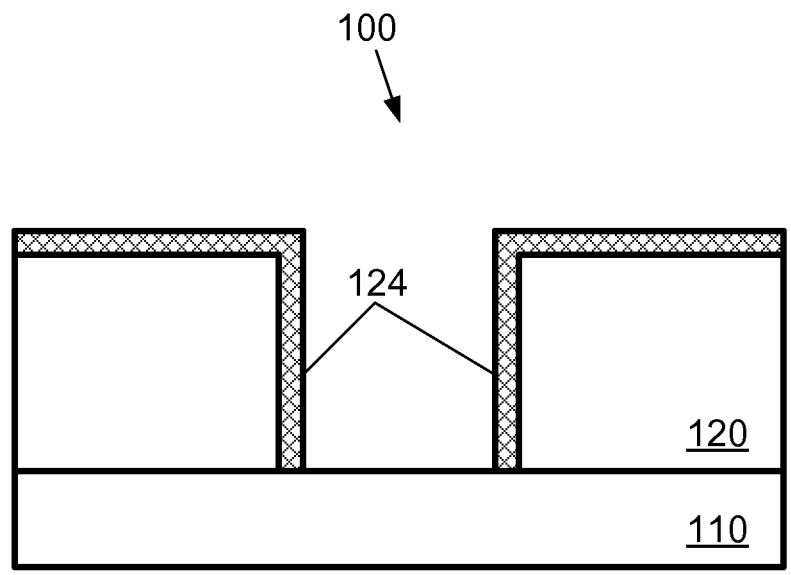

As illustrated in FIG. 1B, an etching process may be performed to transfer pattern 100 into and/or through the low-k layer 120. Exposure of the low-k layer 120 to the etching chemistry (e.g., plasma chemistry) may cause initial damage 122 to the low-k layer 120, particularly along the sidewalls of the pattern formed therein. Furthermore, as illustrated in FIG. 1C when the remaining portion of the mask layer 130 is removed via an ashing process, additional damage 124 is incurred by the exposed portions of the low-k layer 120.

When mask layer 130 contains organic material, such as photo-resist, the ashing process typically uses an oxygen-containing chemistry, such as an oxygen-containing plasma, to remove the organic material. In such cases, the oxygen-containing chemistry may lead to the depletion of carbon, as well as methyl groups (i.e., $CH_3$) in low-k layer 120. The de-methylation of the low-k layer 120 is particularly evident in SiCOH-containing layers. As a result, the low-k layer 120 that has been damaged by these processes suffers from an increased dielectric constant, an increased leakage there through, and an increased hydrophilicity.

Figure 2A:
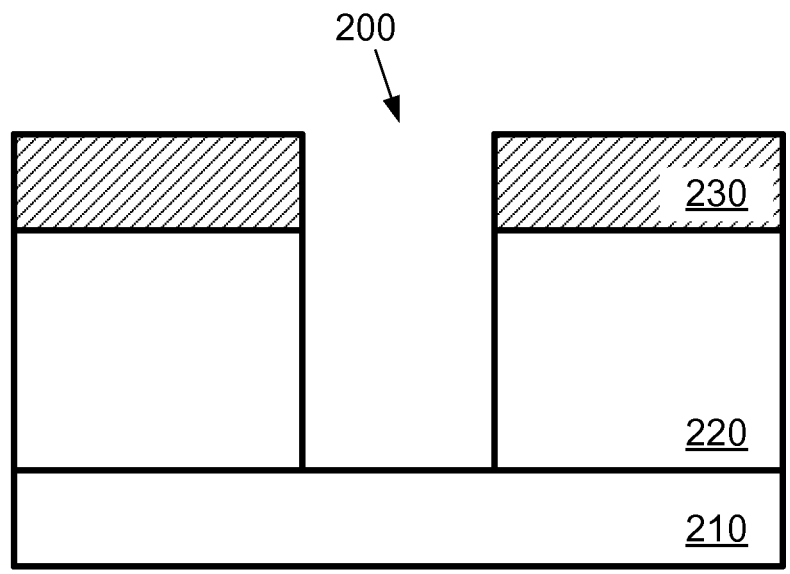
FIGS. 2A through 2E illustrate a schematic representation of a method for patterning a low-k layer while protecting an exposed low-k surface according to an embodiment.

Therefore, according to various embodiments, a method for protecting an exposed low-k surface in order to reduce damage is described. The method is pictorially illustrated in FIGS. 2A through 2E, and presented by way of a flow chart 300 in FIG. 3. As illustrated in FIG. 2A and presented in FIG. 3, the flow chart 300 begins in 310 with receiving a substrate 210 having a mask layer 230 and a low-k layer 220 formed thereon, wherein a pattern formed in the mask layer 230 using a lithographic process has been transferred to the low-k layer 220 using an etching process to form a structural feature 200 therein. Structural feature 200 may include a via, a trench or line, or a trench-via structure prepared using any variety of conventional techniques, including, but not limited to, a single damascene scheme, a dual damascene scheme, a trench-first metal hard mask (TFMHM) patterning scheme, a via-first-trench-last (VFTL) patterning scheme, etc.

Substrate 210 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate.

Low-k layer 220 may include a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the low-k layer 220 may have a dielectric constant of less than 3.7, or a dielectric constant of less than 2.5, or a dielectric constant ranging from 1.6 to 3.7. The low-k layer 220 may be porous or non-porous.

For example, the low-k layer 220 may include a SiCOH-containing material. Additionally, for example, the low-k layer 220 may include a porous inorganic-organic hybrid film comprised of a single-phase, such as a silicon oxide-based matrix having $CH_3$ bonds that hinder full densification of the film during a curing or deposition process to create small voids (or pores). Still alternatively, for example, the low-k layer 220 may include porous inorganic-organic hybrid film comprised of at least two phases, such as a carbon-doped silicon oxide-based matrix having pores of organic material (e.g., porogen) that is decomposed and evaporated during a curing process.

The low-k layer 220 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The mask layer 230 may comprise a layer of radiation-sensitive material, such as photo-resist. The photo-resist may comprise 248 nm nanometer) resist, 193 nm resist, 157 nm resist, EUV (extreme ultraviolet) resist, or electron beam sensitive resist. The photo-resist can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

Additionally, the mask layer 230 may include an anti-reflective coating (ARC) layer, such as a silicon-containing ARC commercially available as Sepr-Shb Aseries SiARC from Shin Etsu Chemical Co., Ltd. The optional ARC layer may, for example, be applied using spin coating technology, or a vapor deposition process.

Furthermore, the mask layer 230 may include an organic planarization layer (OPL) or organic dielectric layer (ODL). The ODL or OPL may include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques or vapor deposition techniques.

Further yet, the mask layer 230 may include a hard mask layer. The hard mask layer may include a metal, or metal-containing material. Additionally, the hard mask layer may include a Si-containing material or C-containing material. The Si- or C-containing material may include silicon oxide ($Si_xO_y$), silicon nitride ($Si_xN_y$), silicon oxynitride ($Si_xO_yN_z$), silicon oxycarbide ($Si_xO_yC_z$), or carbon (diamond-like carbon (DLC), amorphous carbon (a-C), or graphite), together, or any combination thereof for example.

The pattern may be formed in mask layer 230 using a sequence of lithography and optionally etching steps. Once prepared, the pattern (or series of prepared patterns) may be transferred to the underlying thin film, i.e., the low-k layer 220, using one or more etching processes, such as one or more plasma etching processes.

Figure 2B:
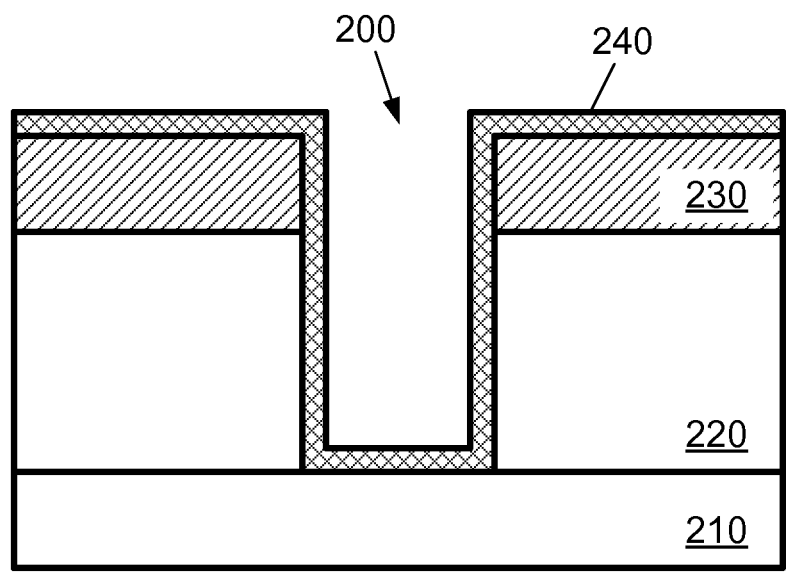
Figure 3:
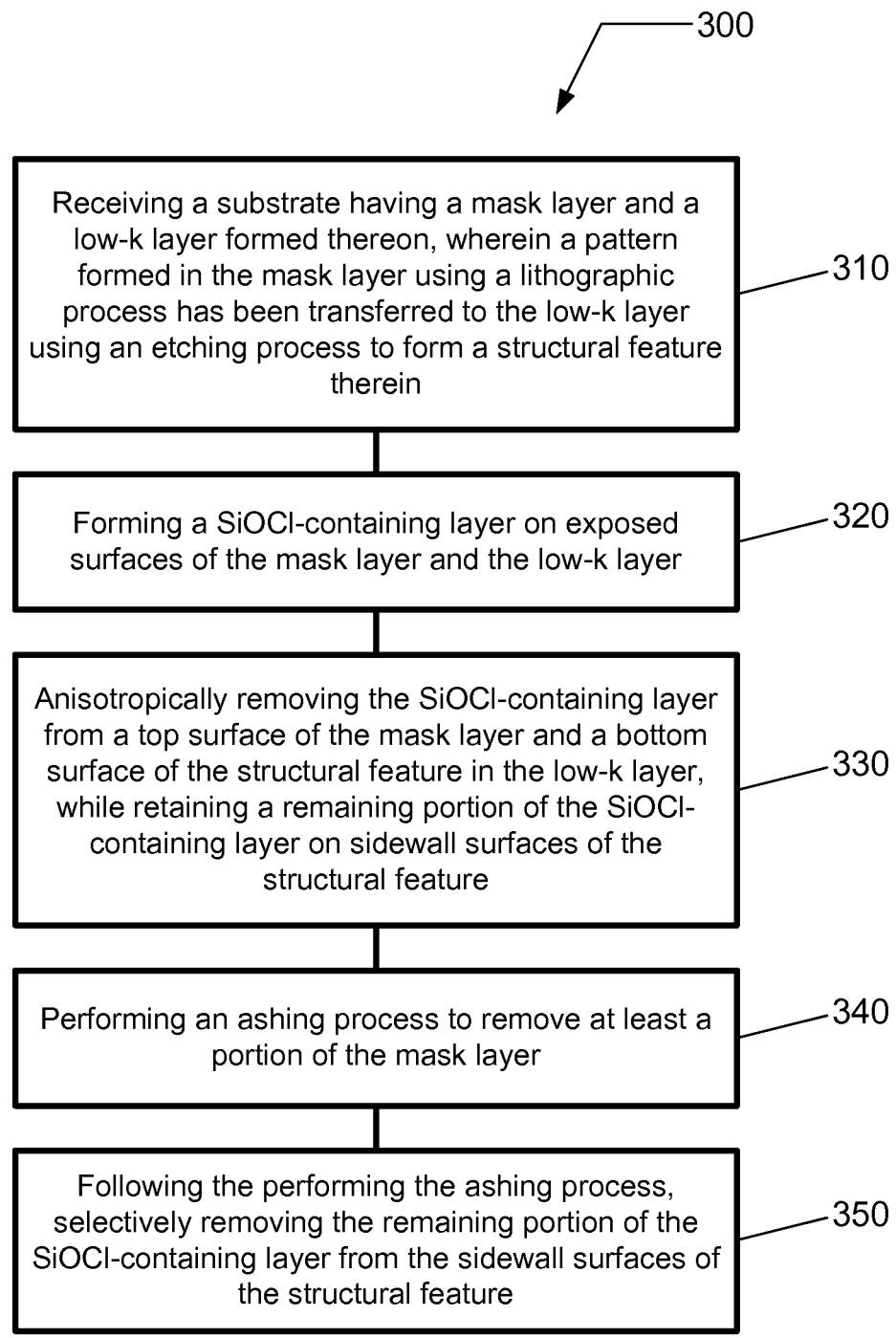
FIG. 3 provides a flow chart illustrating a method for protecting an exposed low-k surface according to an embodiment.

As illustrated in FIG. 2B, in 320, a SiOCl-containing layer 240 is formed on exposed surfaces of the mask layer 230 and the structural feature 200 formed in low-k layer 220. The SiOCl-containing layer 240 contains Si, O, and Cl. The SiOCl-containing layer 240 may be formed by performing a vapor deposition process in an environment containing Si, Cl, and O.

In one embodiment, the SiOCl-containing layer 240 is formed by performing a plasma-assisted deposition process that includes generating plasma using a film forming process composition containing as incipient ingredients $SiCl_4$ and $O_2$. While the film forming process composition includes $SiCl_4$ and $O_2$, other Cl-containing and O-containing gases or vapors are contemplated. For example, the film forming process composition may include as incipient ingredients silane ($SiH_4$), a Cl-containing gas (e.g., $Cl_2$, HCl, etc.), and an oxygen-containing gas (e.g., $O_2$).

To form the plasma in the plasma-assisted deposition process, constituents of the film forming process composition should be selected that exist in a gaseous and/or vapor phase either alone or in combination with a carrier gas (e.g., a noble gas element or nitrogen) at atmospheric and/or vacuum pressures.

The plasma-assisted deposition process may exclude application of a radio frequency (RF) bias to a substrate holder upon which substrate 210 rests. A temperature of substrate 210 may range from about 0 degrees C. to about 100 degrees C. Furthermore, when forming the SiOCl-containing layer 240, at least one process parameter may be adjusted in the plasma-assisted deposition process to increase an etch resistance of the SiOCl-containing layer to a subsequent ashing process that may be used to remove mask layer 230.

In another embodiment, the SiOCl-containing layer 240 is formed by exposing substrate 210 to $SiCl_4$ and $H_2O$, and heating substrate 210. A temperature of substrate 210 may range from about 30 degrees C. to about 100 degrees C.

Figure 2C:
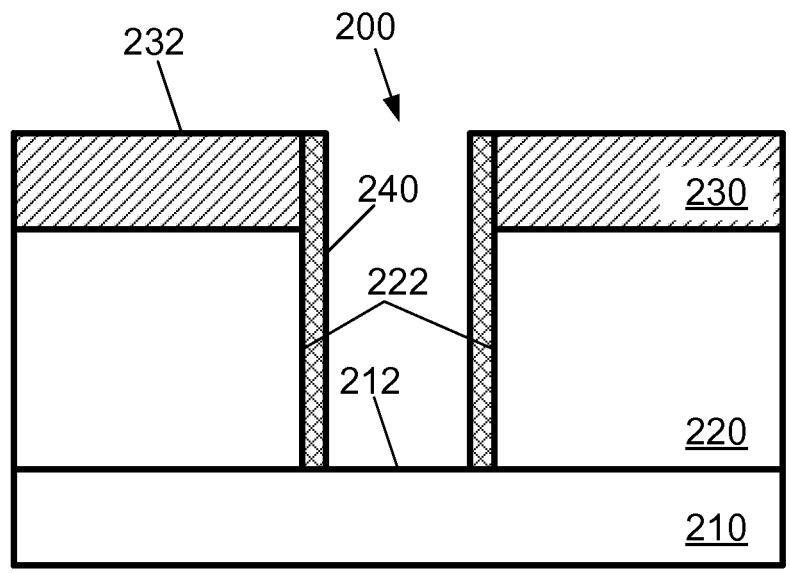

As illustrated in FIG. 2C, in 330, the SiOCl-containing layer 240 is anisotropically removed from a top surface 232 of the mask layer 230 and a bottom surface 212 of the structural feature 200 in the low-k layer 220, while retaining a remaining portion of the SiOCl-containing layer 240 on sidewall surfaces 222 of the structural feature 200. The removal of the SiOCl-containing layer 240 from the top surface 232 of the mask layer 230 and the bottom surface 212 of the structural feature 200 may be performed using one or more etching processes. The one or more etching process may include a dry plasma etching process or a dry non-plasma etching process.

In one embodiment, the dry plasma etching process includes an anisotropic plasma etching process. The anisotropic plasma etching process may include forming plasma from an etching process composition that contains C and F. For example, the etching process composition may include a fluorocarbon (i.e., $C_xF_y$, where x and y are equal to unity or greater).

Additionally, for example, the etching process composition may include a halomethane gas. The halomethane gas may include a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

Additionally, for example, the etching process composition may include a hydrocarbon (i.e., $C_xH_y$, where x and y are equal to unity or greater). Alternatively, for example, the etching process composition may include an additive gas having the chemical formula $C_xH_yR_z$, where R is a halogen element, x and y are equal to unity or greater, and z is equal to zero or greater.

Furthermore, for example, the etching process composition may include a noble gas. The etching process composition may include an oxygen-containing gas, a hydrogen-containing gas, a nitrogen-containing gas, or a carbon-containing gas, or any combination of two or more thereof. For example, the etching process composition may include $H_2$, $O_2$, $N_2$, CO, $CO_2$, $NH_3$, NO, $N_2O$, or $NO_2$, or any combination of two or more thereof. The etching process composition may further include a fluorine-containing gas, a chlorine-containing gas, a bromine-containing gas, or a halide gas. For example, the etching process composition may further include HBr, $F_2$, $Cl_2$, $Br_2$, $BCl_3$, $NF_3$, or $SF_6$.

In one embodiment, the etching process composition for the anisotropic plasma etching process may include a noble gas and one or more gases selected from the group consisting of $CF_4$, $C_4F_6$, $C_4F_8$, and $C_5F_8$. In another embodiment, the etching process composition for the anisotropic plasma etching process may include $CF_4$ and Ar.

The anisotropic plasma etching process may include preparation of an etch process recipe. The etch process recipe may include one or more process conditions defined by one or more process parameters. The one or more process conditions may be established by setting one or more process parameters, such as: setting a flow rate of each constituent of the etching process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to the lower electrode, or a source antenna or upper electrode opposing the lower electrode above the substrate; setting a temperature condition for the plasma processing system; setting a temperature condition for the substrate or substrate holder; setting an etch time; and/or setting an over-etch time. During the anisotropic plasma etching process, any one of the process parameters may be varied.

The anisotropic plasma etching process may include application of a radio frequency (RF) bias to a substrate holder upon which substrate 210 rests. A temperature of substrate 210 may range from about 0 degrees C. to about 100 degrees C. Furthermore, when performing the anisotropic plasma etching process, at least one process parameter may be adjusted in the anisotropic plasma etching process to control a critical dimension (CD) of the structural feature 200, a sidewall profile of the structural feature 200, etc.

In another embodiment, an over-etch process may be performed.

Figure 2D:
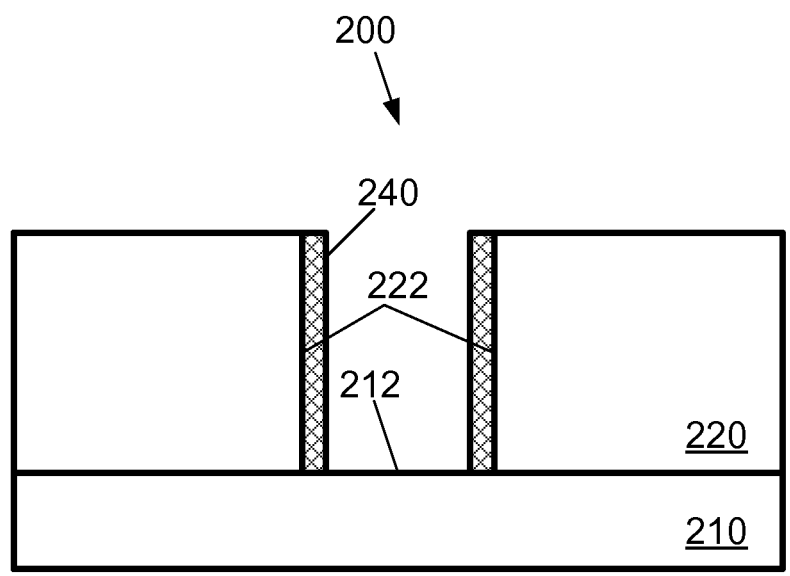

As illustrated in FIG. 2D, in 340, an ashing process is performed to remove at least a portion of the mask layer 330. The ashing process may include one or more ashing steps.

In one embodiment, the ashing process may include a plasma ashing process. For example, the plasma ashing process may include generating plasma using a process composition containing O, N, or H, or any combination of two or more thereof. In another embodiment, the ashing process may include exposing substrate 210 to an oxygen-containing environment. The oxygen-containing environment may include monatomic oxygen (O), diatomic oxygen ($O_2$), triatomic oxygen (ozone, $O_3$), an oxygen-containing molecule, ionized oxygen, metastable oxygen, or any excited state of oxygen, or any combination of two or more thereof. For example, the oxygen-containing environment may contain O, $O_2$, $O_3$, CO, $CO_2$, NO, $N_2O$, or $NO_2$, or any combination of two or more thereof. Additionally, for example, the oxygen-containing environment may include $O_2$.

Figure 2E:
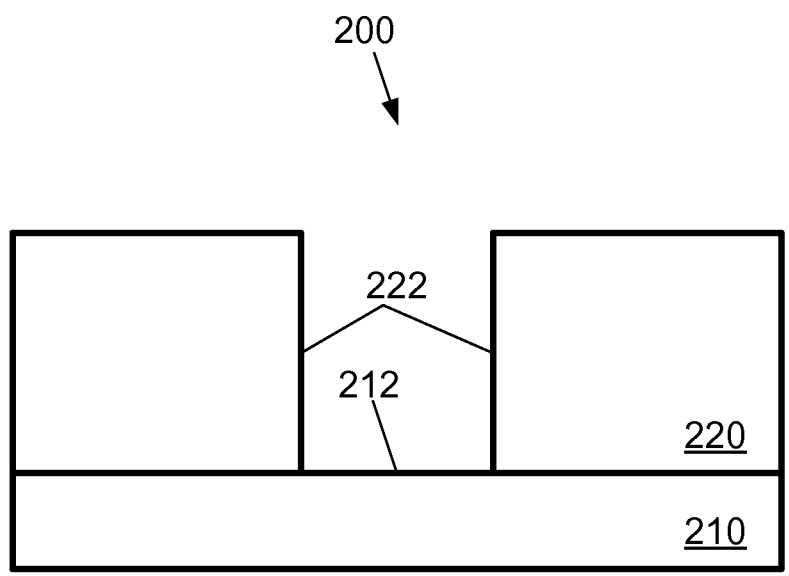

As illustrated in FIG. 2E, in 350, following the performing of the ashing process, the remaining portion of the SiOCl-containing layer 240 is selectively removed from the sidewall surfaces 222 of structural feature 200.

In one embodiment, the selective removal of the remaining portion of the SiOCl-containing layer 240 from the sidewall surfaces 222 of the structural feature 200 is achieved by performing a wet cleaning process. For example, the wet cleaning process may include immersing the remaining portion of the SiOCl-containing layer in an HF solution, such as a dilute aqueous HF solution.

In one embodiment, the deposition process for forming the SiOCl-containing layer, the anisotropic plasma etching process, and the ashing process are performed in the same plasma processing system. In an alternate embodiment, the deposition process for forming the SiOCl-containing layer, the anisotropic plasma etching process, and the ashing process are performed in separate plasma processing systems.

In another embodiment, at least two of the formation of the SiOCl-containing layer, the anisotropic plasma etching process, and the ashing process are repeated multiple cycles, e.g., two or more cycles until the sidewall surfaces 222 of structural feature 200 are adequately protected.

Figure 4A:
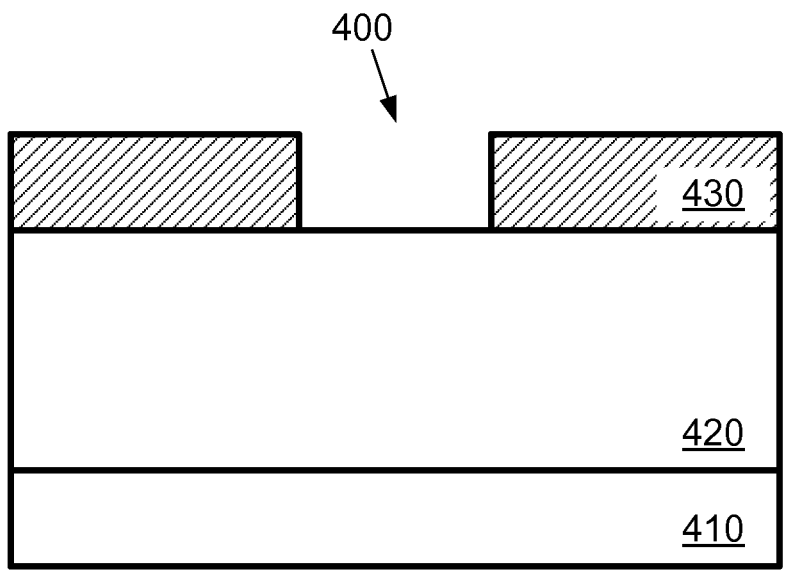
FIGS. 4A through 4F illustrate a schematic representation of a method for patterning a low-k layer while protecting an exposed low-k surface according to another embodiment.

According to another embodiment, a method for protecting an exposed low-k surface to reduce damage is described. The method is pictorially illustrated in FIGS. 4A through 4F. As illustrated in FIG. 4A, a substrate 410 having a mask layer 430 and a low-k layer 420 formed thereon is received, wherein a pattern has been formed in the mask layer 430 using a lithographic process and optionally one or more etching process.

Figure 4B:
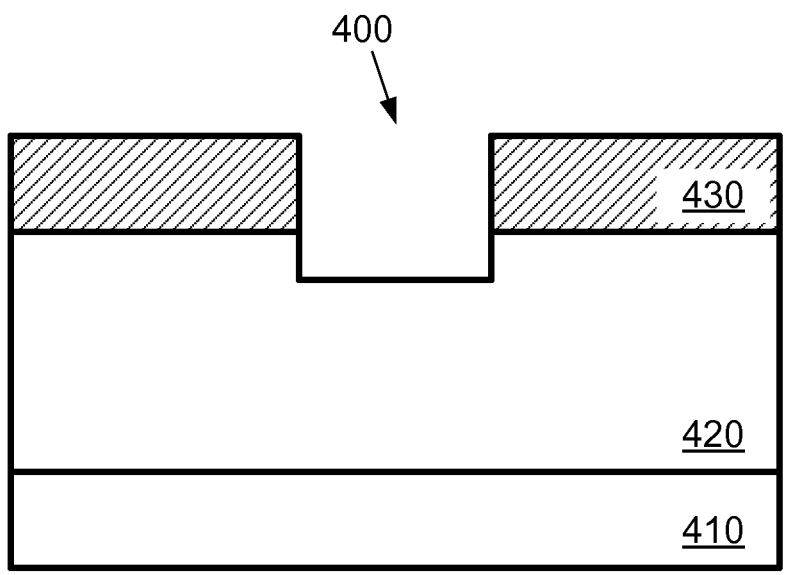

As illustrated in FIG. 4B, the pattern is partially transferred from the mask layer 430 to the low-k layer 420 using one or more etching processes to form at least the initial stage of a structural feature 400 therein. Structural feature 400 may include a via, a trench or line, or a trench-via structure prepared using or according to any variety of conventional techniques, including, but not limited to, a single damascene scheme, a dual damascene scheme, trench-first metal hard mask (TFMHM) patterning scheme, a via-first-trench-last (VFTL) patterning scheme, etc.

Figure 4C:
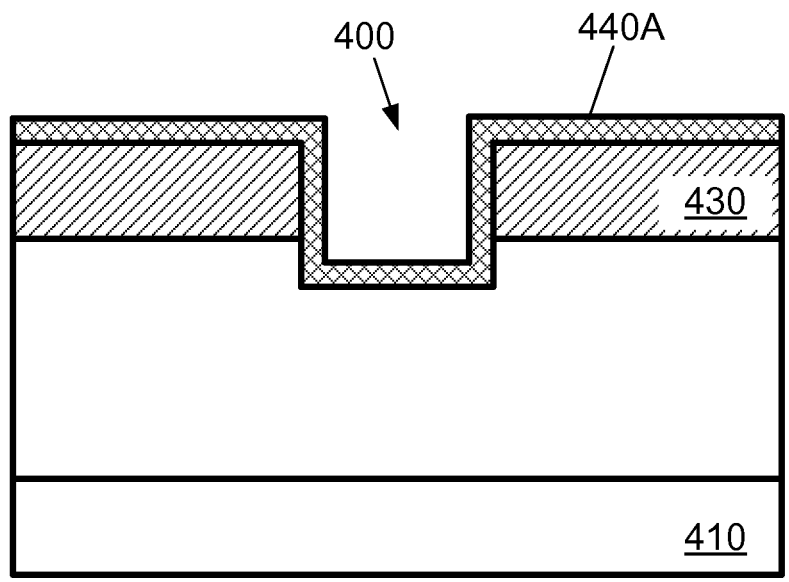
Figure 4D:
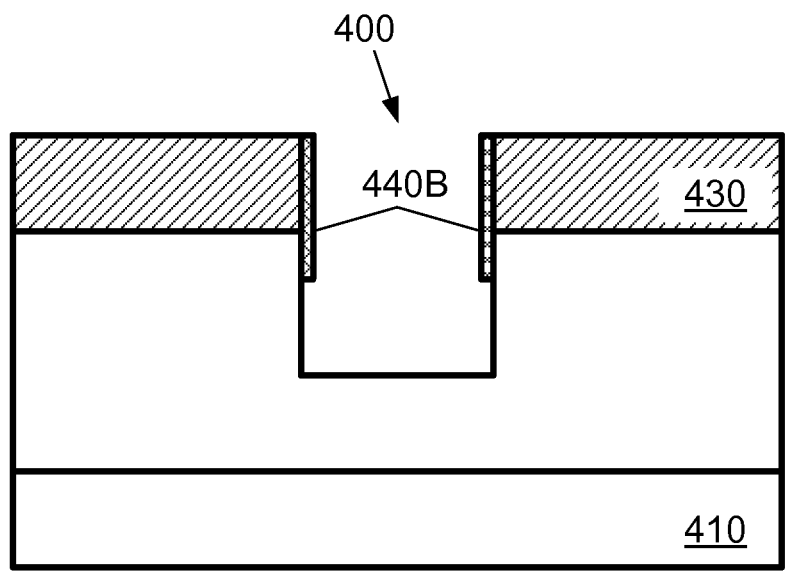

As illustrated in FIG. 4C, a SiOCl-containing layer 440A is formed on exposed surfaces of the mask layer 430 and the structural feature 400 partially formed in the low-k layer 420. Thereafter, as illustrated in FIG. 4D, the structural feature 400 is evolved deeper into the low-k layer 420 using one or more additional etching processes. As shown in FIG. 4D, during the one or more additional etching processes, the SiOCl-containing layer 440A may be at least partially removed from the mask layer 430 and possibly thinned along the sidewalls of the structural feature 400 in low-k layer 420 to leave a residual SiOCl-containing layer 440B. However, the presence of the residual SiOCl-containing layer 440B on the sidewalls of the evolving structural feature 400 may reduce interaction of the low-k layer 420 with the etching chemistry, e.g., plasma chemistry, of the one or more additional etching process.

Figure 4E:
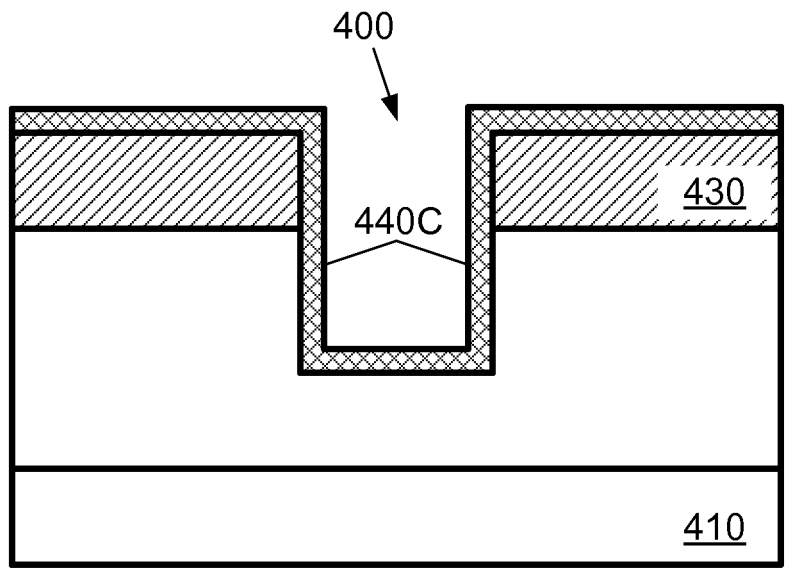
Figure 4F:
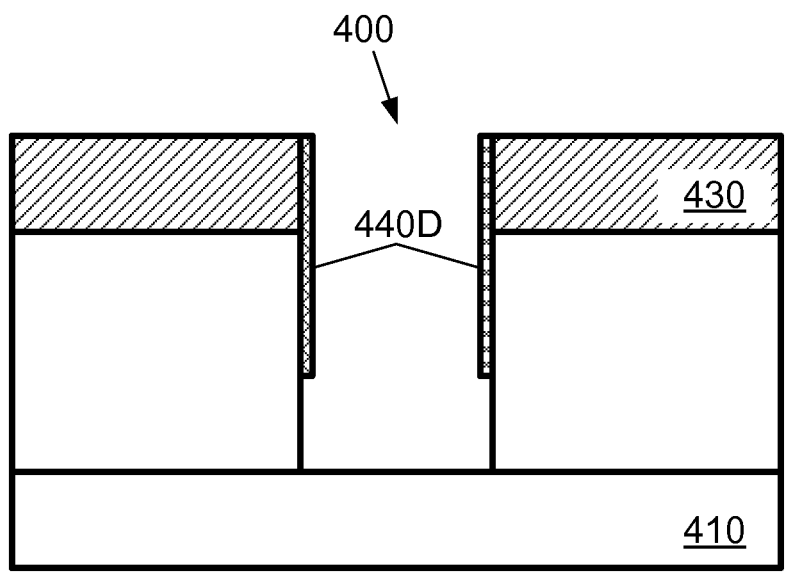

Then, as illustrated in FIG. 4E, an additional SiOCl-containing layer 440C is formed on exposed surfaces of the mask layer 430 and the structural feature 400 partially formed in the low-k layer 420. Thereafter, as illustrated in FIG. 4F, the structural feature 400 is evolved even deeper into the low-k layer 420 using one or more yet additional etching processes. As shown in FIG. 4F, during the one or more yet additional etching processes, the SiOCl-containing layer 440C may be at least partially removed from the mask layer 430 and possibly thinned along the sidewalls of the structural feature 400 in low-k layer 420 to leave an additional residual SiOCl-containing layer 440D. The sequence of steps performed during formation of the structural feature 400 into and through low-k layer 420 may protect the sidewalls of the evolving structural feature 400 and reduce damage as the sidewalls of the structural feature are exposed to the etching chemistry.

The etch-deposit-etch-deposit (etc.) scheme described in FIGS. 4A through 4F may be utilized to protect exposed surfaces of the low-k layer 420 while the structural feature 400 evolves during patterning, thus, limiting interaction between the low-k layer 420 and the etch chemistry. The limited interaction may reduce the damage to the low-k layer 420.

One or more of the methods for performing any one of the deposition process for forming the SiOCl-containing layer, the anisotropic plasma etching process, and the ashing process according to various embodiments described above may be performed in any one of the plasma processing systems illustrated in FIGS. 5 through 11 and described below.

Figure 5:
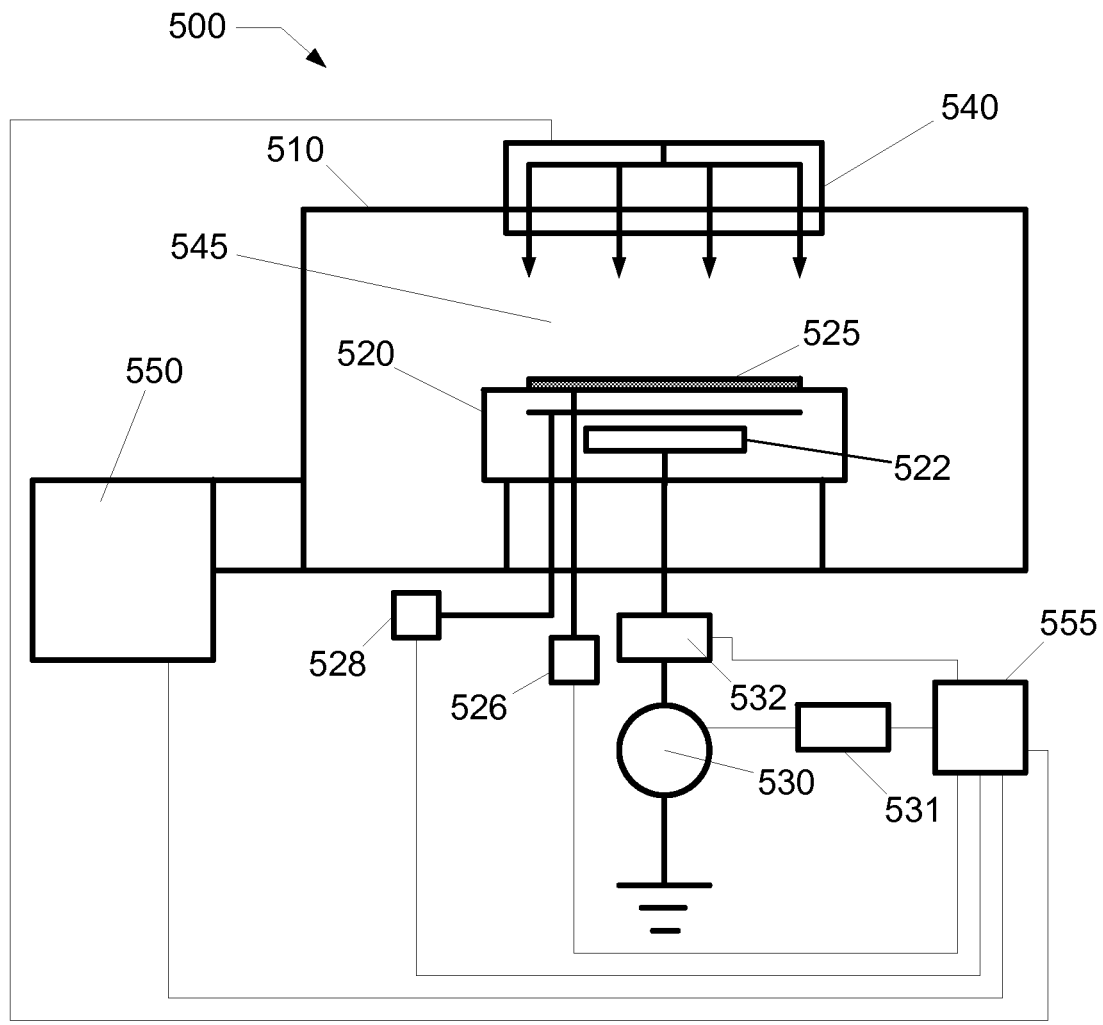
FIG. 5 shows a schematic representation of a plasma processing system according to an embodiment.

According to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a predetermined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, π-type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

Figure 6:
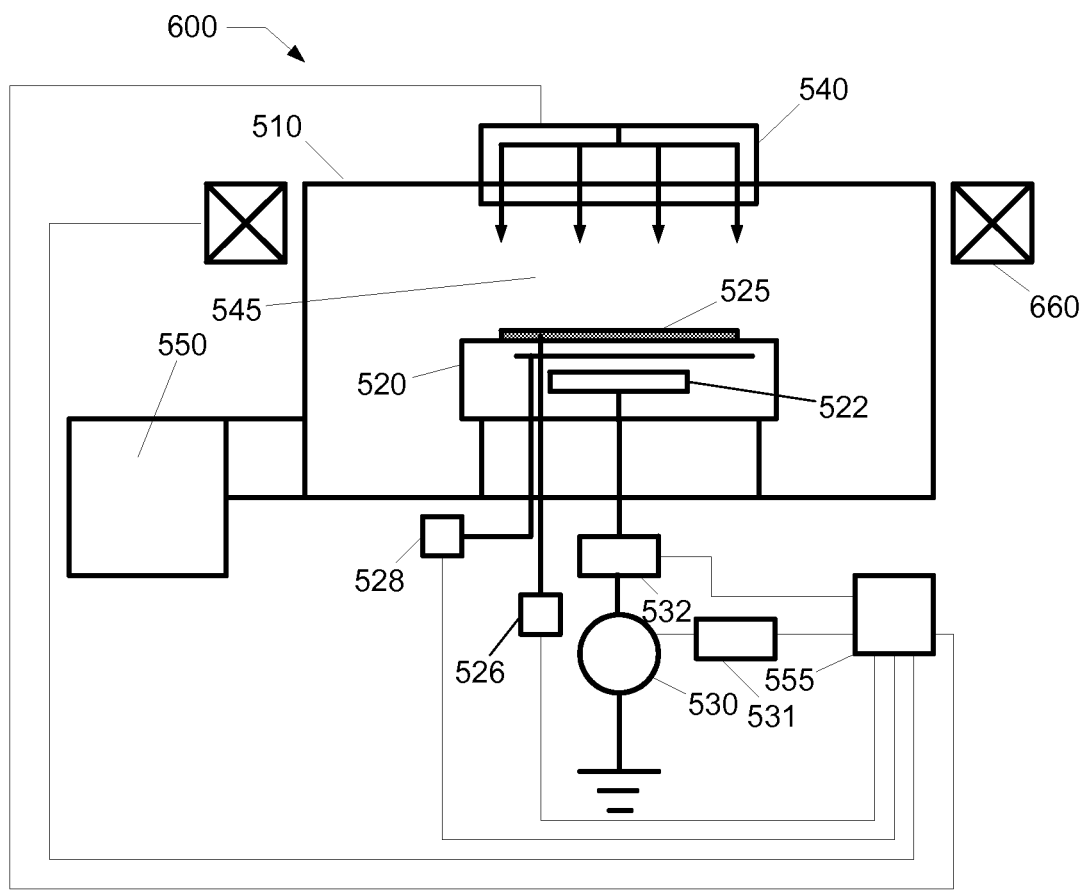
FIG. 6 shows a schematic representation of a plasma processing system according to another embodiment.
Figure 7:
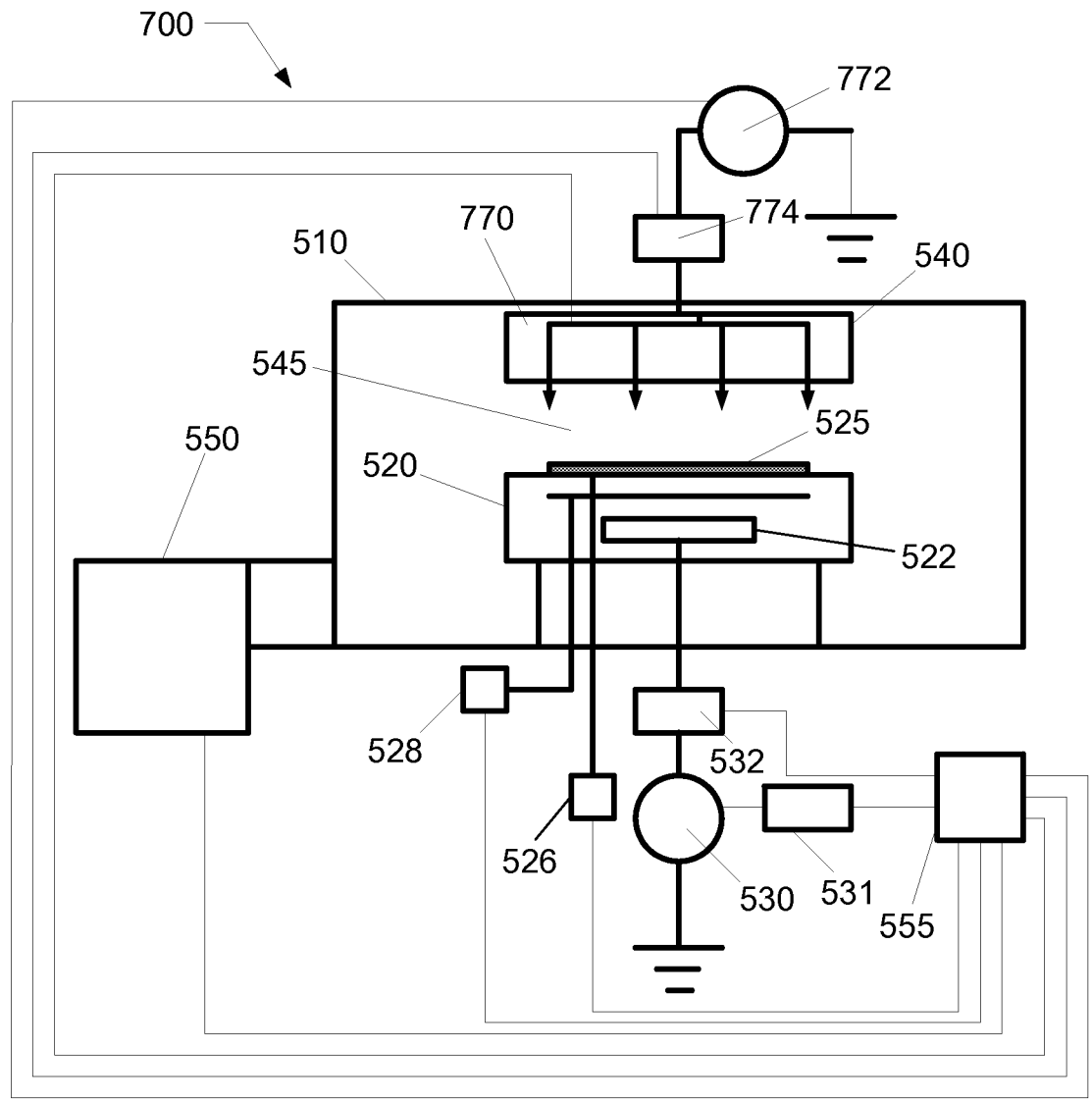
FIG. 7 shows a schematic representation of a plasma processing system according to another embodiment.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
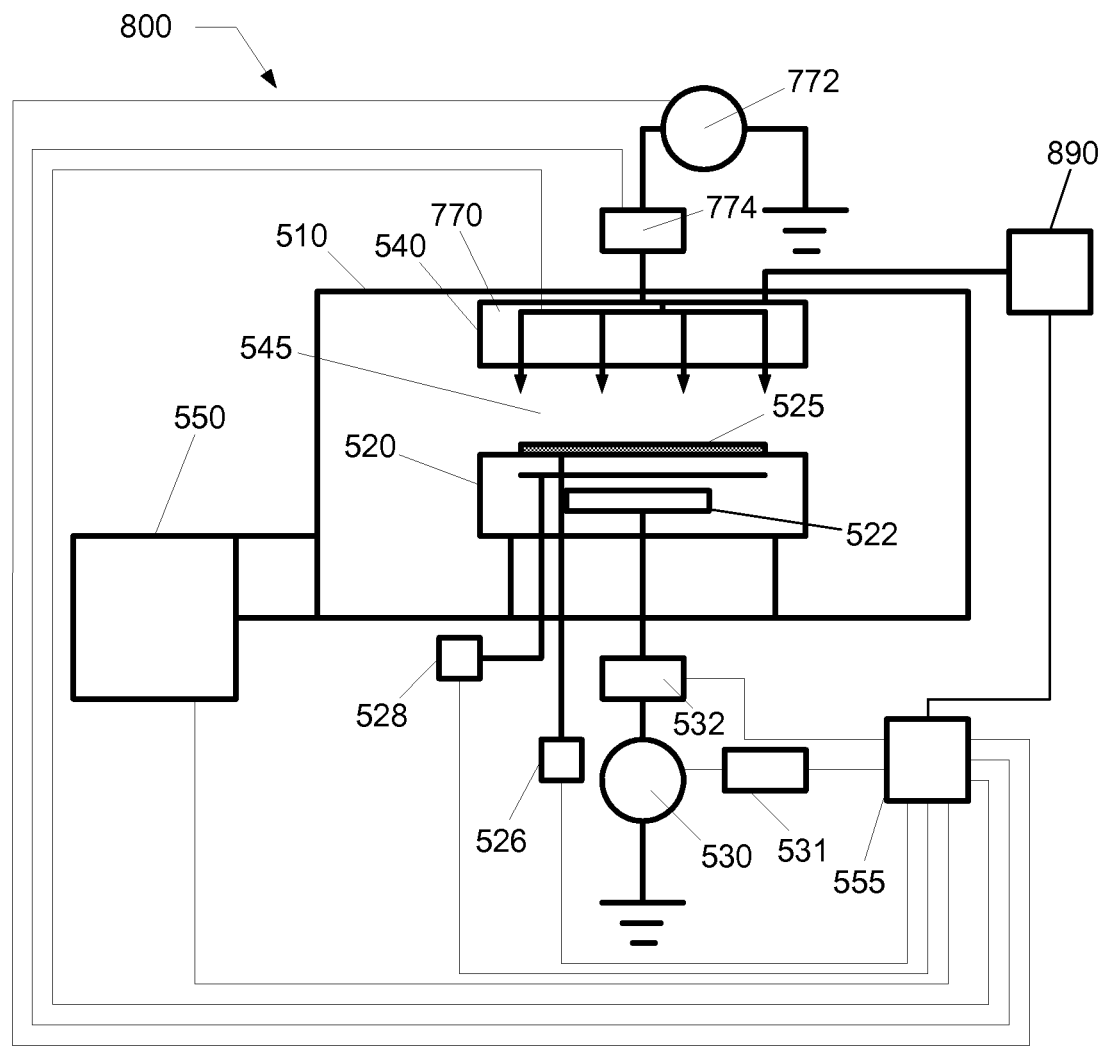
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
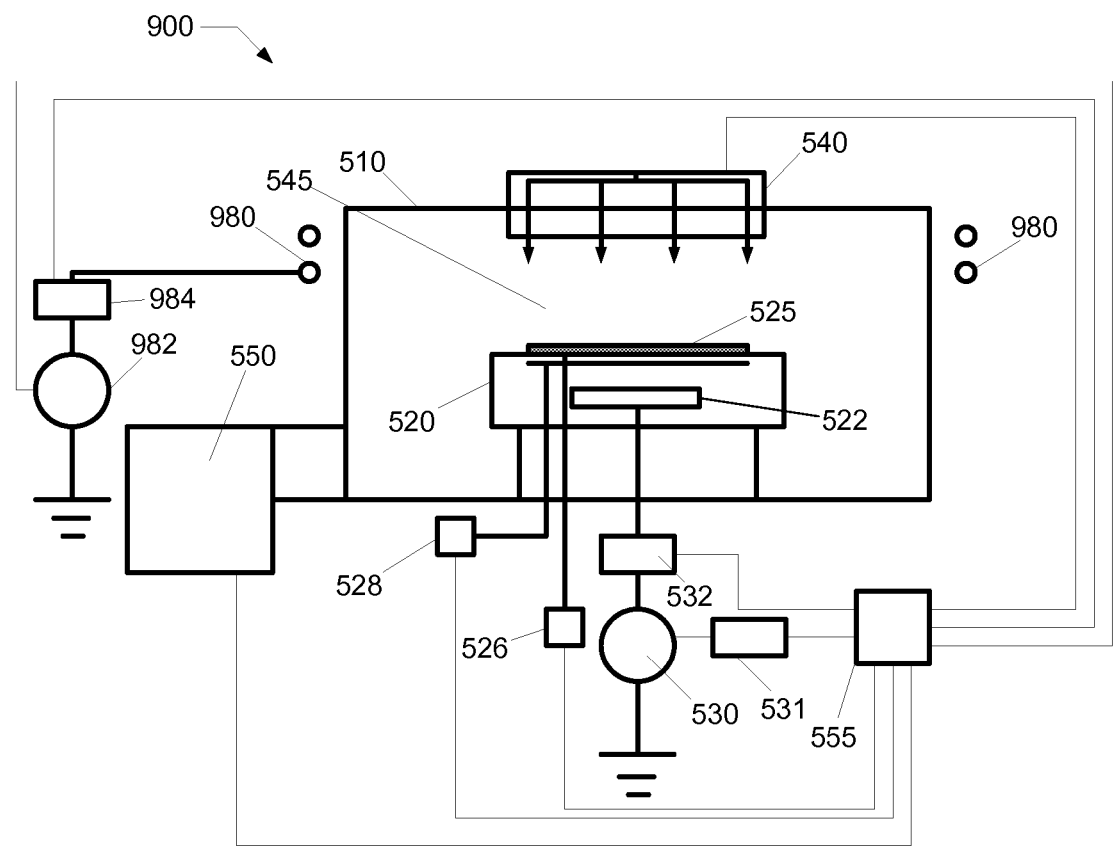
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
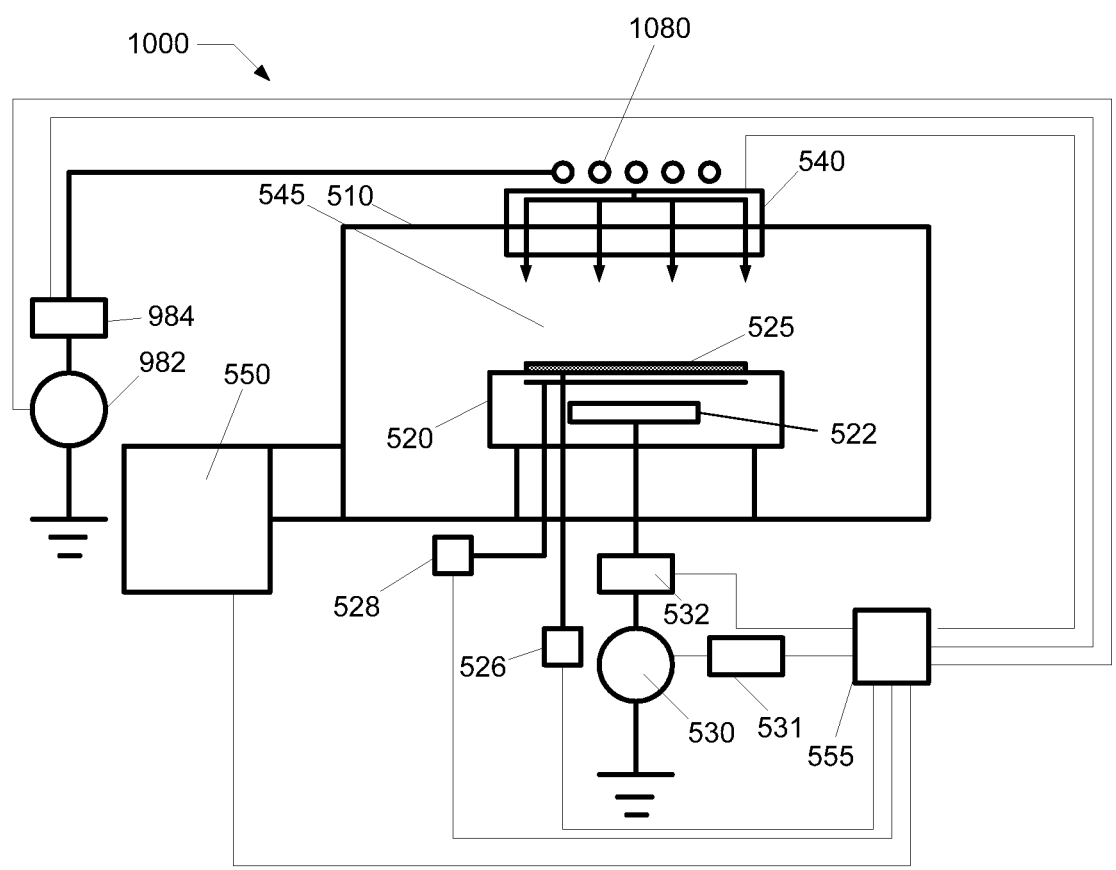
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
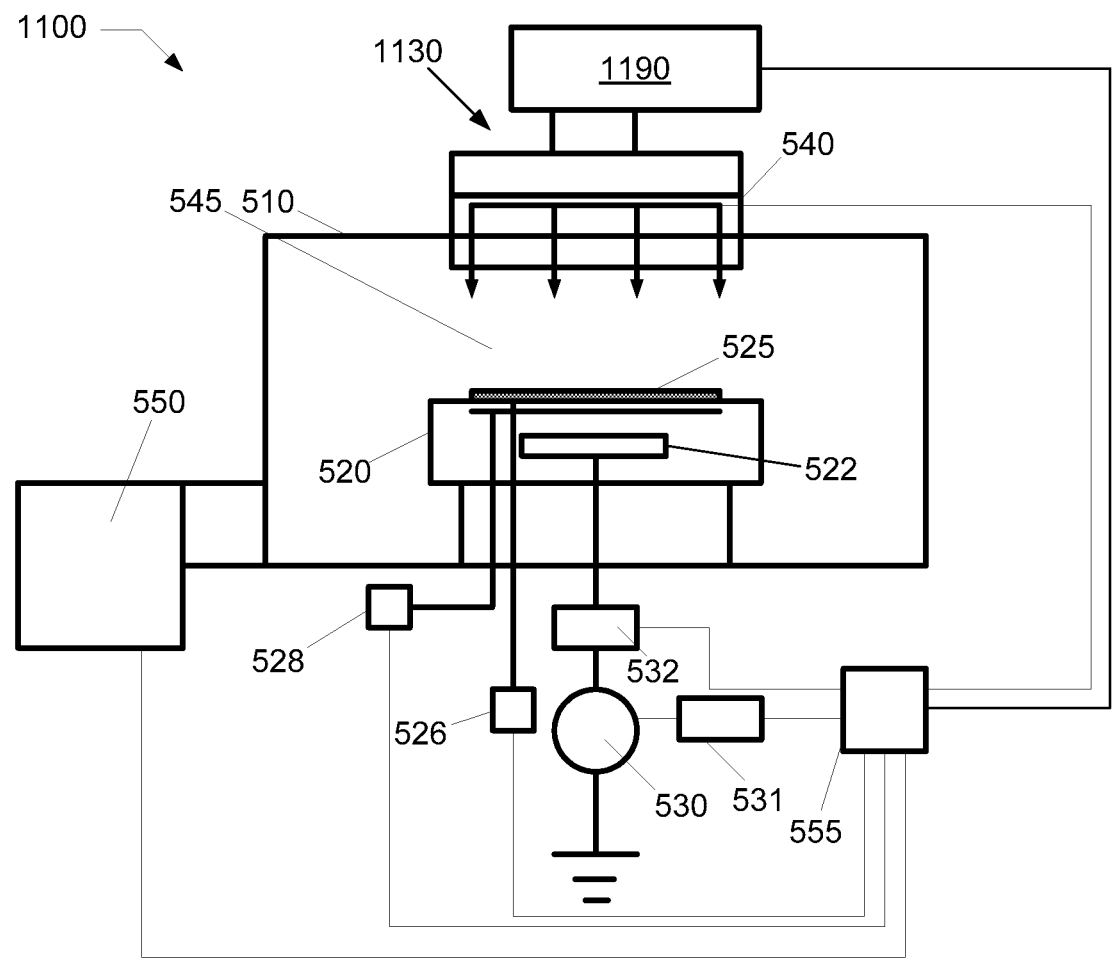
FIG. 11 shows a schematic representation of a plasma processing system according to another embodiment.

In the embodiment shown in FIG. 11, plasma processing system 1100 can be similar to the embodiment of FIG. 5, and can further comprise a surface wave plasma (SWP) source 1130. The SWP source 1130 can comprise a slot antenna, such as a radial line slot antenna (RLSA), to which microwave power is coupled via a power coupling system 1190.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for protecting an exposed low-k surface, comprising:
    receiving a substrate having a mask layer and a low-k layer formed thereon, wherein a pattern formed in said mask layer using a lithographic process has been transferred to said low-k layer using an etching process to form a structural feature therein;
    forming a SiOCl-containing layer on exposed surfaces of said mask layer and said low-k layer;
    anisotropically removing said SiOCl-containing layer from a top surface of said mask layer and a bottom surface of said structural feature in said low-k layer, while retaining a remaining portion of said SiOCl-containing layer on sidewall surfaces of said structural feature;
    performing an ashing process to remove at least a portion of said mask layer; and
    following said performing said ashing process, selectively removing said remaining portion of said SiOCl-containing layer from said sidewall surfaces of said structural feature.

2. The method of claim 1, wherein said forming said SiOCl-containing layer comprises performing a vapor deposition process in an environment containing Si, Cl, and O.

3. The method of claim 1, wherein said forming said SiOCl-containing layer comprises performing a plasma-assisted deposition process that includes generating plasma using a process composition containing as incipient ingredients $SiCl_4$ and $O_2$.

4. The method of claim 3, wherein said plasma-assisted deposition process excludes application of a radio frequency (RF) bias to a substrate holder upon which said substrate rests.

5. The method of claim 3, wherein a temperature of said substrate ranges from about 0 degrees C. to about 100 degrees C.

6. The method of claim 3, wherein said forming said SiOCl-containing layer comprises adjusting at least one process parameter in said plasma-assisted deposition process to increase an etch resistance of said SiOCl-containing layer to said ashing process.

7. The method of claim 1, wherein said forming said SiOCl-containing layer comprises exposing said substrate to $SiCl_4$ and $H_2O$, and heating said substrate.

8. The method of claim 1, wherein said anisotropically removing said SiOCl-containing layer comprises using an anisotropic plasma etching process that includes generating plasma using a process composition containing as incipient ingredients a $C_xF_y$-containing gas and a noble gas.

9. The method of claim 8, wherein said anisotropic plasma etching process comprises applying a radio frequency (RF) bias to a substrate holder upon which said substrate rests.

10. The method of claim 1, wherein said ashing process comprises generating plasma using a process composition containing O, N, or H, or any combination of two or more thereof.

11. The method of claim 1, wherein said selectively removing said remaining portion of said SiOCl-containing layer from said sidewall surfaces of said structural feature comprises performing a wet cleaning process.

12. The method of claim 11, wherein said selectively removing said remaining portion of said SiOCl-containing layer from said sidewall of said structural feature comprises immersing said remaining portion of said SiOCl-containing layer in a dilute aqueous HF solution.

13. The method of claim 1, wherein said structural feature comprises a via, a trench, or a trench-via structure.

14. The method of claim 13, wherein said trench-via structure is formed using a trench-first metal hard mask scheme or a via-first trench-last scheme.

15. The method of claim 1, wherein said mask layer includes a layer of radiation-sensitive material.

16. The method of claim 15, wherein said substrate further includes an anti-reflective coating (ARC) layer and optionally an organic planarization layer (OPL) disposed between said layer of radiation-sensitive material and said low-k layer.

17. The method of claim 1, wherein said low-k layer comprises a dielectric constant less than a value of 4.

18. The method of claim 1, wherein said low-k layer comprises a dielectric constant less than a value of 2.5.

19. The method of claim 1, wherein said low-k layer comprises a porous low-k layer or a non-porous low-k layer.

20. The method of claim 1, wherein said low-k layer comprises a SiCOH-containing layer.

* * * * *